United States Patent [19]

Maruyama et al.

[11] 4,433,202
[45] Feb. 21, 1984

[54] THIN FILM SOLAR CELL

[75] Inventors: Eiichi Maruyama, Kodaira; Toshikazu Shimada, Tokyo; Yasuhiro Shiraki, Hino; Yoshifumi Katayama, Tokorozawa; Hirokazu Matsubara, Tokyo; Akitoshi Ishizaka, Kokubunji; Yoshimasa Murayama, Koganei; Akira Shintani, Machida, all of Japan

[73] Assignee: Hitachi, Ltd., Tokyo, Japan

[21] Appl. No.: 362,115

[22] Filed: Mar. 26, 1982

[30] Foreign Application Priority Data

Mar. 30, 1981 [JP] Japan .................................. 56-45554

[51] Int. Cl.³ ............................................ H01L 31/06
[52] U.S. Cl. .................................... 136/255; 136/258; 357/15; 357/30; 357/59; 357/2
[58] Field of Search ................ 136/258 PC, 258 AM, 136/255; 357/30, 59, 15, 2

[56] References Cited

U.S. PATENT DOCUMENTS 4,321,420 3/1982 Kaplan et al. ...................... 136/255
4,343,830 8/1982 Sarma et al. ......................... 427/38

FOREIGN PATENT DOCUMENTS 54-158190 12/1979 Japan ............................. 136/258 PC

OTHER PUBLICATIONS

A. Matsuda et al., "Electrical & Structural Properties of Phosphorus-Doped Glow Discharge Si:F:H and Si:H Films," *Jap. J. Appl. Phys.*, vol. 19, pp. L305-L308, (1980).
M. Hirose, "Some New Fabrication Technologies of Amorphous Silicon", pp. 39-44, 50 in Amorphous Semiconductor Technologies & Devices, (1982).

*Primary Examiner*—Aaron Weisstuch
*Attorney, Agent, or Firm*—Antonelli, Terry & Wands

[57] ABSTRACT

A thin film solar cell formed on a substrate, comprising at least first and second electrodes, at least one of which is capable of passing light, a silicon film interposed between said first and second electrodes, and at least one junction formed in the silicon film for separating electrons and positive holes when the cell is exposed to light, wherein said silicon film comprises a mixed phase consisting of a polycrystalline phase and an amorphous phase, and includes at least about 50% by volume of fibrous crystalline grains, each of said grains having a maximum bottom diameter of about 1 μm and a minimum height of about 50 nm and having its grain boundaries terminated with a monovalent element.

The solar cell has a high photoelectric conversion efficiency comparable to that of a single-crystal solar cell, and can be produced at a low cost.

12 Claims, 6 Drawing Figures

THIN FILM SOLAR CELL

The present invention relates to a solar cell using a silicon film.

There have been, so far, proposed three types of silicon solar batteries or cells; those using single crystal silicon, those using polycrystalline silicon, and those using amorphous silicon wherein the recombination centers are terminated with hydrogen, fluorine, etc.; some of these have already been put into practice. An example of the amorphous silicon solar cell is disclosed in *Appl. Phys. Lett.* Vol. 28 (1976), page 671, by D. E. Carlson and C. R. Wronski.

In general, the single crystal solar cell has the highest photoelectric conversion efficiency of the three types of cells, but it must be subjected to a high temperature processing in its fabrication, which results in the production cost being relatively high. On the other hand, the amorphous silicon solar cell has the advantage that the production cost becomes relatively low because the cell is fabricated at a low temperature, but it also has a disadvantage that its photoelectric conversion efficiency has been about ½ to ⅓ of that of the single-crystal cell. The conversion efficiency of the polycrystalline silicon cell will be between those of the single-crystal and amorphous silicon cells. However, recombination centers at or around grain boundaries in the polycrystalline silicon act to reduce the conversion efficiency. For this reason, the efficiency will be remarkably reduced as the grain size becomes small, which makes it difficult to form a thin film solar cell of good efficiency with microcrystalline grains.

Accordingly, it is an object of the present invention to provide a thin film solar cell which eliminates the above defects, has a high conversion efficiency comparable to the single-crystal solar cell, and can be manufactured at a low production cost.

According to one aspect of the present invention, there is provided a silicon film of a mixed phase which mainly consists of fibrous crystalline grains in which the recombination centers in the vicinity of the grain boundaries are terminated by different types of elements. Typically, "fibrous" crystalline grains have a columnar or cone-like shape and are elongated in the direction of growth. However, they are not limited to long grains, as will be described later.

More specifically, an embodiment of the present invention provides a thin film solar cell which comprises a substrate, at least a transparent first electrode and a second electrode, a thin film mainly formed of silicon interposed between said first and second electrodes, and at least one photovoltaic barrier formed in the thin film for separating photo-ionized carriers (electrons and positive holes), wherein said silicon film comprises a mixed phase consisting of a polycrystalline phase and an amorphous phase, and contains 50% or more of such fibrous crystalline grains by volume ratio that have a bottom diameter not larger than 1 μm and a height of at least 50 nm, and the recombination centers present at the grain boundaries thereof are substantially terminated. The substrate can concurrently function as one of the electrodes when made of a conductor. The barrier may be formed of a grown pn junction or other junctions or contacts which establish a built-in field or potential barrier.

It is preferable that the general orientation of the longitudinal (growth) directions of the fibrous grains form an angle of 45° to 90° with respect to said barrier plane. The recombination centers present at crystalline grain boundaries in said silicon film are terminated by at least one member selected from the group consisting of hydrogen, oxygen, fluorine, chlorine, iodine, lithium, sodium, potassium, cesium and rubidium.

The above and other objects, features and advantages of the present invention will be apparent from the following detailed description taken in conjunction with the accompanying drawings, in which.

Figure 1:
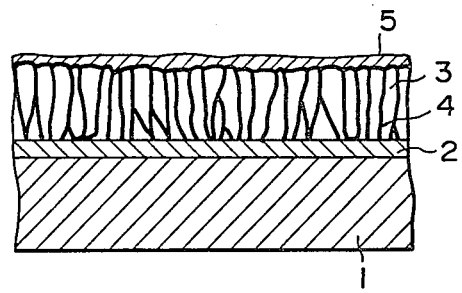
FIG. 1 is a schematic cross-sectional view, in part, of a silicon-based film solar cell in accordance with an embodiment of the present invention.

Terminated amorphous silicon suitable for the practice of this invention may be characterized in that its optical absorption coefficient around the peak wavelength of solar radiation is greater than that of single-crystal silicon by one order of magnitude or more. Therefore, a thin amorphous silicon film or layer of about 1 μm in thickness is sufficient to effectively absorb solar light energy around the peak wavelength. In other words, the amount of amorphous silicon necessary for a solar cell can be considerably reduced compared to a single-crystal silicon solar cell, which must have a thickness of the order of about 100 μm or more for mechanical reasons. An amorphous silicon solar cell which is formed on an appropriate substrate is considered to be effective for saving resources.

The inventors have found that a large optical absorption coefficient comparable to that of amorphous films can also be obtained by a polycrystalline film provided that the grain size of the polycrystalline silicon film is made sufficiently small. This may be considered to arise from the fact that the grain boundaries and/or the vicinity thereof in a polycrystalline film have a bonding state similar to that of the amorphous material (loss of crystal symmetry), thereby exhibiting a large optical absorption coefficient. Such a film may be considered to be a mixed phase constituted by a crystalline phase and an amorphous phase, which state is referred to as a mixed phase in this specification. The optical absorption coefficient of the mixed phase material depends on the volume ratio of the crystalline phase portion and the amorphous phase portion, and further on the grain size distribution. Generally, the smaller the size the micro-crystalline grain, the larger the absorption coefficient is. Also, as the grain size becomes larger the absorption coefficient tends to be close to that of the monocrystalline material.

Since many recombination centers usually exist in the grain boundaries, the photo-excited electrons and positive holes have short lifetimes, and thus such a polycrystalline silicon will exhibit only a small photo-conductivity. These recombination centers are mainly associated with dangling bonds. Therefore, if the dangling bonds are terminated by at least one member selected from the group consisting of atoms and atom groups including such elements as hydrogen, oxygen, fluorine, chlorine, iodine, lithium, sodium, potassium, cesium and rubidium, then the recombination centers will be remarkably decreased in number and thus the polycrystalline silicon film will exhibit a high photo-conductive property. Most of the added elements are introduced not into the interior of the crystal grains but in the vicinity of the grain boundaries. Said group of elements includes monovalent elements such as halogen elements or monovalent metallic elements. The polycrystalline silicon film thus terminated can be regarded as a mixed phase film having a crystalline phase and a terminated amorphous phase disposed in the vicinity of the grain boundaries.

In the terminated amorphous silicon, the diffusion length of positive holes generated by incident rays is reported to be about 50 nm, which is very short compared with several tens of microns in crystalline silicon, while the diffusion length of electrons is of the order of 500 to 1000 nm. For this reason, the efficiency of the electrons and positive holes generated by light in the terminated amorphous silicon and diffusing to the junction portion of the solar cell and contributing to electricity generation is smaller than that in single-crystal silicon which has larger diffusion lengths. Therefore, the photo-electric conversion efficiency in amorphous silicon is still low.

If the film structure of a solar battery is so arranged that electrons and positive holes are generated in a terminated amorphous phase portion and are caused to diffuse or flow under the influence of a built-in electrical field into crystalline phase portions and then to move through the crystalline phase portions in the vertical direction to the junction portion of the solar battery, the film will have a larger optical absorption coefficient than that of a single-crystalline film and also have a longer mean diffusion length of electrons and positive holes than the diffusion length of the terminated amorphous film.

A polycrystalline silicon film grown on a glass or stainless steel substrate may comprise crystalline grains of column-like and/or cone-like structure, a so-called fibrous structure. Accordingly, if such a film structure could be made wherein electrons and positive holes generated in a terminated amorphous phase portion will diffuse or flow under the influence of a built-in electrical field into crystalline phase portions and thereby move through the crystalline phase in the vertical direction to the junction plane of the solar cell, then the effective diffusion length can become about the same as that of electrons and holes in the crystalline phase, whereby the photo-electric conversion efficiency and thus carrier collection efficiency will increase.

There is shown in FIG. 1, in cross section, such a film structure of a solar cell as described above according to an embodiment of the present invention. A substrate 1 is made of glass, ceramic, metal (for example, stainless steel or nickel) or thermostable high-polymer resin (for example, polyimide resin). When the substrate is made of an insulating material, a lower metallic electrode 2 may be deposited on the substrate. If the substrate is made of a conductive material, then the substrate can be also used as an electrode. Above the substrate, a fibrous (column-like and/or cone-like) polycrystalline silicon film 3 is formed on the electrode 2. The polycrystalline silicon film 3 can be formed by a thermal decomposition CVD (chemical vapour deposition) process, a glow discharge CVD process, sputtering process, an ion plating process, a high frequency sputtering process, an ultra-high vacuum deposition process, or other various processes. However, if the deposition rate is too fast or the temperature of the substrate is too low or the atmosphere in formation of the polycrystalline film contains too many hydrogen or oxygen atoms, then it becomes difficult to grow a film in the form of large fibrous crystalline grains and growth of an amorphous phase or smaller micro-crystalline grains will result. Since a polycrystalline silicon film formed with fibrous crystalline grains is necessary for the achievement of the present invention, the conditions for forming the film must be suitably controlled. More specifically, it is necessary to adjust the substrate temperature, the pressure of atmospheric gas, the gas flow rate, the input power, the deposition rate, and so on. During formation of the polycrystalline film, the conductivity of the film can be controlled by properly adding or doping a small quantity of P-type of N-type impurity into the atmospheric gas or into the raw silicon material. Using these techniques an ohmic contact is formed between the lower electrode 2 and the polycrystalline silicon film 3, and PN-junctions are formed in the polycrystalline silicon film 3. This is referred to as the grown junction technique. The PN-junction forming technique based on thermal diffusion is not preferable in the case of polycrystalline film devices, although it is usually used preferably in the case of formation of single-crystalline silicon devices. This is because the diffusion rate of impurities along grain boundaries is faster than that of impurities in the interior of the crystal grains and thus it is almost impossible to form a uniform junction plane. For this reason, it is desirable to employ not the thermal diffusion technique but the ion implanation or the grown junction technique in the formation of junctions in a thin film solar cell. In this connection, forming a low resistivity N+ or P+ type layer adjacent to the interface with the lower electrode 2 will enhance the formation of an ohmic contact to the electrode. When a highly doped layer is formed adjacent to the electrode layer, a polycrystalline film which has large grain sizes can be formed at a low temperature. This is convenient for the formation of a structure suited to the present invention. The thickness of the N+ or P+ type layer is preferably between 5 nm and 1 μm.

After having formed the polycrystalline film 3, the film is terminated to quench or diminish dangling bonds in the vicinity of the grain boundaries. The termination is carried out by heat-treating the polycrystalline film 3 in a plasma atmosphere containing at least one element selected from the group consisting of hydrogen, oxygen, fluorine, chlorine, iodine, lithium, sodium, potassium, cesium and rubidium, etc. The quantity of element doped into the polycrystalline film 3 is between about 10 ppm by atomic ratio and about 5 atomic-%. When the doped quantity is in the above range, the photoelectric conversion efficiency of the resulting polycrystalline film can become high enough to allow practical applications of the film, although it also depends on the grain size to some extent.

The heat treatment in a plasma atmosphere is usually effected under the following conditions: The atmospheric gas pressure is in the range of $10^{-3}$ Pa to 10 Pa, the substrate temperature is in the range of 350° C. to 700° C., the high frequency input is in the range of 0.03 W/cm² to 10 W/cm² and the frequency of the input is usually 13.56 MHz although it is not limited thereto. Under this treatment, the vicinity of the grain boundaries in the polycrystalline film 3 is terminated. Finally, a suitable material such as indium-tin oxide is coated on the film 3 to form a transparent electrode 5, for example, by the known sputtering process.

Figure 2:
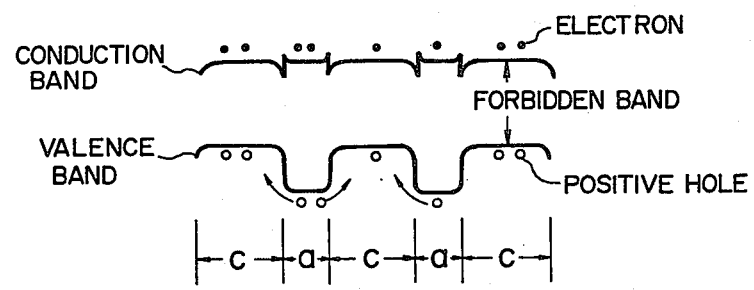
FIG. 2 is an exemplary diagram for explanation of the relationship between the band structures and carriers (electrons and holes) produced or excited by light in the case when the silicon film consists of a mixed phase consisting of a crystalline phase and an amorphous phase.

Since terminated amorphous silicon usually has a wider forbidden band than crystalline silicon, the following two phenomena or actions will take place in the vicinity of the interface between the terminated amorphous phase portion and crystalline phase portion. Firstly, since a thin terminated amorphous layer of wider band gap covers the surface of each crystalline grain at least in the vicinity of the surface of the solar cell through which light rays pass into the film 3, recombination at the light receiving surface is suppressed, i.e., a window effect takes place, whereby the photoelectric conversion efficiency of incident radiant ray energy to electrical energy can be raised. The interface or grain boundary between the crystalline grains and the terminated amorphous silicon layers could be as illustrated in FIG. 2. That is, electron-positive hole pairs generated in the terminated amorphous layer having a wider forbidden band are moved into the grains under the influence of a built-in electrical field established around the interface between the amorphous layer and the grain and are collected. In this case, a field is preferably generated in such a manner that most of the minority carriers generated in the amorphous layer will be moved into the adjacent grains. Further, in the case of the structure as shown in FIG. 2, the electron-positive hole pairs generated in the amorphous phase are advantageously separated spatially, whereby the possibility of recombination can be reduced. In FIG. 2, reference character "a" refers to an amorphous region and reference character "c" refers to a crystalline region. As a result, most of the minority carriers excited by light are caused to diffuse through crystalline grains so that a high collection efficiency can be obtained when compared with the case where the carriers are diffused through amorphous silicon region having a short diffusion length. As will be clear from the above explanation, it is preferable that electrons and positive holes once moved into crystal grains are diffused to the junction or barrier portion of the solar cell without returning to the amorphous region. Accordingly, it is desirable that the height of the fibrous (column-like and/or cone-like) crystalline grains is great enough such that the fibrous grains are continuous in the main part of the film thickness, in contrast to the diameter of the bottom surface of each grain, and that the direction of growth of each fibrous grain is substantially vertical to the junction or barrier plane of the solar cell.

Although the gist of the invention has been explained in the foregoing, description will next be made quantitatively.

Figure 3:
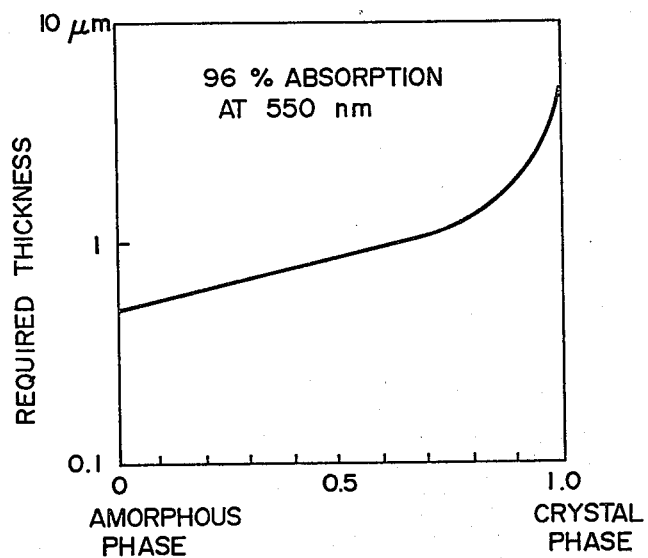
FIG. 3 is a graph showing the relationship between the mixture ratio of the mixed phase and the film thickness necessary for light absorption.

FIG. 3 shows a graph showing the relationship between the film thickness required for absorbing 96% of the photons of wavelength about 550 nm, which is the peak wavelength of solar radiation energy, and the volume ratio of crystalline grain contained in the film, including a terminated amorphous phase and a crystalline phase. It will readily be seen from FIG. 3 that if the terminated amorphous silicon layer has a thickness of at least 0.5 μm, the film can sufficiently absorb the above-mentioned lights. On the other hand, if the film contains 50% of crystalline phase by volume percentage, the necessary film thickness will be increased about twice. Therefore, when it is taken into consideration that the diffusion length of electrons and positive holes in the amorphous phase is remarkably short, it is preferable that the film contain some several tens volume percent (i.e. around 50% by volume) of crystalline phase for enhancing the transport of carriers. Also, the effect of the addition of amorphous phase becomes clear when about 0.1% by volume of amorphous phase is present and becomes significant when about 1% by volume of amorphous phase is present.

Figure 4:
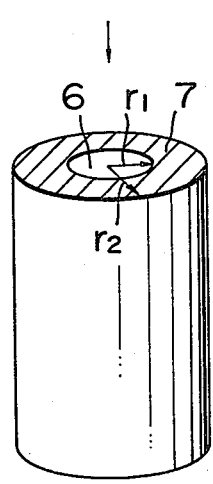
FIG. 4 is a model diagram of a fibrous crystalline grain which is covered with a terminated amorphous phase.

Next, explanation will be made in conjunction with the model of a fibrous crystalline grain as shown in FIG. 4.

Assuming a mixed phase film of amorphous phase layers and fibrous crystal grains, and that each fibrous crystal grain (whose radius is $r_1$) 6 is surrounded, in this example, by an amorphous layer 7 (whose outer radius is $r_2$) of 50 nm in thickness, corresponding to the diffusion length of carriers in the amorphous phase layers.

$$r_2 - r_1 = 50$$

$$\frac{\pi r_1^2}{\pi r_2^2} = R$$

Where, R denotes the volume ratio of crystalline phase to the total of the amorphous and crystalline phase in the film and also is expressed as follows:

$$R = \left( \frac{r_1}{50 + r_1} \right)^2$$

For example, if the bottom surface of the column grain has a diameter of 100 nm ($r_1 = 50$ nm), then R is 0.25 and the film contains 25% of crystalline grains by volume percentage. If the diameter of the bottom surface of the grain is 1 μm ($r_1 = 500$ nm), then the film contains about 80% of crystalline phase by volume percentage. It will be understood that the practical film structure is not so simple as described above and hence the volume ratio of the crystal grain will be altered according to the various conditions.

The above consideration is very important in practical formation of the film structure according to the present invention. That is, it is common practice to form the film by first forming a fibrous (column-like or cone-like) crystalline phase film by a suitable process and subsequently by terminating dangling bonds in the vicinity of interfaces or grain boundaries with the use of the above-said plasma process. In this case, the depth into the crystalline grains effected by the plasma process is substantially independent of the grain size. Therefore, in the case where the volume ratio of crystalline phase to terminated amorphous phase should be controlled during the plasma processing time, the simplest way is to control the size of crystalline grains to be prepared. The height of the fibrous crystalline grains is preferably as high as possible for a given film thickness as has been explained above, and thus "grain size" to be controlled will refer to the diameter of the bottom surface of a fibrous (column-like or cone-like) crystalline grain.

According to experimental results by the inventors, the grain size of the polycrystalline film must be 1 μm at most in order for the film to be terminated by the plasma process and to exhibit mixed phase features including the high optical absorption coefficient. In other words, if the film has a larger grain size than 1 μm, i.e., larger than most of the wavelengths of the incident radiation, then the mixed phase film will not be found to have a clear difference in optical absorption coefficient from that of a single-crystal film. According to another aspect of the present invention, it is desirable that the height of the crystalline grains be longer than the diffusion length of positive holes in the amorphous phase layers, that is, 50 nm. This will be apparent from the fact that in a grain of less than 50 nm in height, carriers cannot travel more than 50 nm without crossing a crystal boundary. Consequently, with the solar cell according to the present invention, the crystalline grains should contain at least 50% of such fibrous (column-like and/or cone-like) grains by volume percentage, that have a diameter of the bottom surface not greater than about 1 μm (usually, the diameters being larger than 30 or 50 Å), and a height of at least about 50 nm (usually, heights being below 100 μm). Further, if the general orientation of the grain heights is not substantially vertical to the junction or barrier face of the solar cell, the effect of the present invention will be diluted or weakened. Therefore, it is preferable that the general orientation of the direction of growth of grains forms an angle of 45° to 90° with respect to the junction or barrier face.

The general orientation of the direction of growth of grain (grain heights) is expressed by the following equation.

$$H = \frac{\sum_{k=1}^{N} h_k}{N}$$

Where, $h_k$ denotes a height vector of a fibrous (column-like or cone-like) crystalline grain in the film, and N denotes the total number of crystalline grains of interest. Furthermore, the thickness of the silicon film for the solar cell is in the range of about 5000 Å to about 5 μm and thus it is about the same as that of an ordinary film.

The present invention will be explained with reference to preferred embodiments.

Embodiment 1

Figure 5:
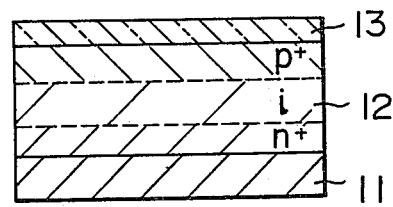
FIG. 5 is a cross-sectional view of a thin film solar cell.

There is shown in FIG. 5 a cross-sectional view of the basic structure of a thin film solar cell in accordance with an embodiment of the present invention.

A stainless steel substrate 11 is mirror-polished at its surface and placed in a vacuum chamber under a vacuum of $1 \times 10^{-4}$ Torr. The substrate is heated to 500° C., and is exposed to Ar gas which contains 10% of SiH$_4$ and which is flowing at a velocity of 100 cc/min. Then, the gas is discharged under the following conditions: a pressure of 1 Torr, and input power having a frequency of 13.56 MHz and a power of 100 W. A polycrystalline silicon film 12 of 2 μm in thickness is deposited on the substrate 11 by the so-called plasma CVD process. The deposition rate is about 2 Å/sec. During formation of the film, 50 ppm of PH$_3$ or 100 ppm of B$_2$H$_6$ is mixed into the raw material gas so that an N+ type layer of 100 nm in thickness, an I type layer of 1.8 μm in thickness and a P+ type layer of 100 nm in thickness are formed sequentially on the substrate. Under these conditions, crystalline grains contained in the formed silicon film have a bottom surface diameter of 0.2 μm and an average height of 1 μm. After the film has been formed, the film is exposed in a plasma environment formed in a hydrogen atmosphere of $5 \times 10^{-2}$ Torr for a period of one hour at a substrate temperature of 300° C. (in which case, the input power has a frequency of 13.56 MHz and a power or 50 W), for the purpose of termination processing of dangling bonds. At this stage, the amount of hydrogen atoms contained in the film is about 0.1 atom percent. Thereafter, indium-tin oxide is sputtered on the polycrystalline silicon film 12 at a substrate temperature of 150° C. to form a transparent electrode 13 of 100 nm in thickness, whereby a solar cell has been completed.

Although hydrogen has been used in this embodiment as the element introduced into the grain boundaries of the polycrystalline silicon film 12, oxygen or any halogen element such as fluorine, chlorine, bromine, iodine or combinations thereof, or alternatively any monovalent metallic element such as lithium, sodium, potassium, cesium, rubidium or combinations thereof may be used.

Figure 6:
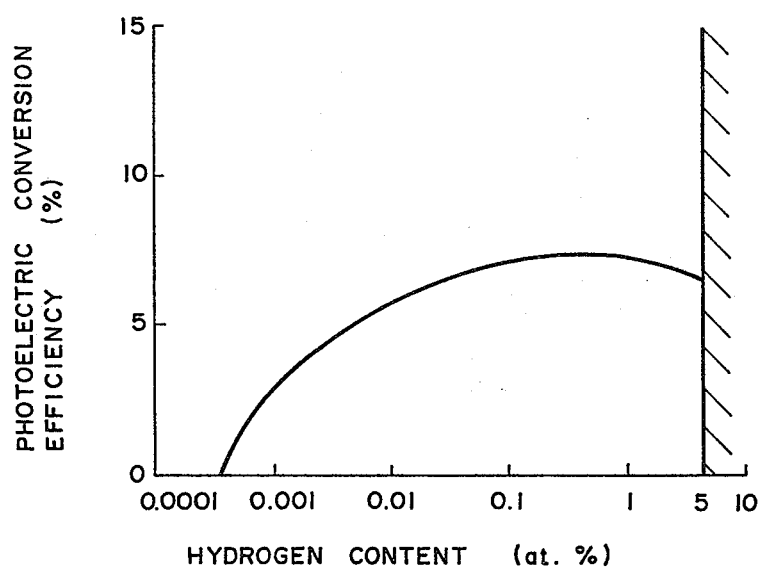
FIG. 6 is a graph showing the relationship between the hydrogen content in the silicon film and the photoelectric conversion efficiency.

FIG. 6 shows a graph showing an exemplary relationship between the hydrogen content in the silicon film obtained in Embodiment 1 and the photoelectric conversion efficiency (η) of the solar cell based on the film. As will be seen from the figure, a conversion efficiency available for practical application can be obtained in the range of above 10 ppm, but it is practically impossible to operate or use the films in the range of above 5 atom percent hydrogen because of the difficulty of introducing hydrogen atoms into the silicon film upon formation of the film.

Table 1 below illustrates conversion efficiencies for different elements introduced into silicon films. The basic forming procedure of the films are the same as in the above embodiment. In the Table, "None" means a case where no termination processing of dangling bonds is performed in the above-mentioned production steps for the purpose of comparison.

Although the film of P-I-N junction structure has been employed in this embodiment, it will be easily understood that a P-N junction or Schottky contact may be used to realize the solar cell or battery.

TABLE 1

| Contained elements (atom. %) | None | H 1.0 | F 0.8 | O 0.5 | I 0.4 | Na 0.1 | H + F 1 + 0.5 | F + I 0.3 + 0.2 | H + Li 0.8 + 0.1 | Cl 0.4 | H + Cl 1.5 + 0.2 |
|---|---|---|---|---|---|---|---|---|---|---|---|
| Conversion efficiency (%) | 0.8 | 6.7 | 6.5 | 5.5 | 5.2 | 5.0 | 6.5 | 6.0 | 5.5 | 7.0 | 6.0 |

Embodiment 2

Explanation will be made by reference to the cross-sectional view of the solar cell shown in FIG. 1.

An alumina substrate 1 with a molybdenum electrode 2 deposited on its surface is placed in a vacuum chamber, and a polycrystalline silicon film 3 of 3 μm in thickness is formed on the molybdenum electrode 2 at a substrate temperature of 550° C. by an ion plating process. Crystalline grains contained in the resulting silicon film 3 have a bottom surface diameter of 0.3 μm and an average height of about 1 μm. During formation of the film, silicon doped with Ga or Sb or pure silicon is used as raw material so that a P+ layer of 15 nm in thickness, an I layer of 2800 nm and an N+ layer of 5 nm in thickness are formed sequentially on the substrate. The substrate is kept at a temperature of 550° C. and HF gas at $5 \times 10^{-3}$ Torr is introduced into the vacuum chamber. The coated substrate is exposed to a plasma formed in the HF gas by an input rf power of 50 W and 13.56 MHz for 30 minutes. This plasma processing causes the grain boundaries in the polycrystalline silicon to be terminated. At this stage, the amount of hydrogen atoms contained in the silicon film is about 0.2 atom percent. Subsequently, a mixture of $SnCl_4$ gas and $H_2O$ gas added to $N_2$ gas at 1 atmosphere is directed onto the silicon film which is kept at a temperature of 550° C. so as to form a transparent electrode 5 on the film 3 via thermal decomposition. At this point, a solar cell has been completed. The conversion efficiency of the obtained cell was in the range from about 5.5 to about 6.0%.

Embodiment 3

A hard glass substrate having a tantalum film sputtered on its surface as a translucent electrode is placed in a vacuum chamber. The substrate is kept at a temperature of 600° C. and in the environment of Ar gas at $3 \times 10^{-3}$ Torr and a polycrystalline silicon film of 1 μm in thickness is formed on the surface of the substrate by means of sputtering of a silicon target. Crystalline grains contained in the resultant film have a bottom surface diameter of 0.2 μm and an average height of about 0.8 μm. The target is replaced sequentially with In-doped silicon, pure silicon, and As-doped silicon targets so as to respectively form a P+ layer of 50 nm thickness, an I layer of 900 nm thickness and an N+ layer of 50 nm thickness. Thereafter a sodium and chloride containing gas is introduced into the vacuum chamber. The coated substrate is exposed to the plasma formed in Ar gas having sodium and chlorine therein at a substrate temperature of 600° C. in the chamber. The amount of Na atoms contained in the resulting silicon film is about 0.1 atom percent. An aluminium electrode is then deposited on the silicon film to obtain a solar cell. In this case, light is passed from the side of the glass substrate. The conversion efficiency of the solar cell was about 5%.

Embodiment 4

An alumina substrate with a molybdenum electrode sputtered onto its surface is placed in a vacuum chamber. The substrate is kept at 700° C. and a gas mixture of $SiF_4$, $SiH_4$ and $H_2$ is introduced into the chamber under a pressure of 1 Torr. A 4 μm thick layer of polycrystalline silicon is formed on the substrate under a glow discharge by an RF power source of 200 W. During the deposition, $PH_3$ gas having a partial pressure of $1.3 \times 10^{-3}$ Pa is introduced into the chamber at the beginning stage of the deposition, whereas $B_2H_6$ gas having a partial pressure of $1.3 \times 10^{-3}$ Pa is introduced therein at the ending stage thereof, so that an N+ layer of 100 nm thickness, an I layer of 3800 nm thickness and a P+ layer of 100 nm thickness are formed in sequence on the substrate. Crystalline grains contained in the resulting silicon film have a bottom surface diameter of 0.4 μm and an average height of 1.2 μm. The silicon film so obtained is already F terminated without use of the plasma process and contains fibrous crystalline grains which have a high photo-conductivity. The amount of F atoms contained in the resultant film was about 0.8 atom percent. Indium-tin oxide is then sputtered onto the silicon film at a substrate temperature of 350° C. to form a transparent electrode. The conversion efficiency of the obtained solar cell was about 6.5%.

As has been described in connection with the above embodiments, the thin film solar cell according to the present invention has a composition similar to the crystalline phase and exhibits a high photoelectric conversion efficiency, whereby the solar cell can be manufactured inexpensively and find a wide range of industrial applications.

What is claimed is:

1. A thin film silicon solar cell formed on a substrate, comprising:

a layered structure disposed on the substrate, including at least a first electrode, a thin film comprising silicon formed on said first electrode, and a second electrode formed on said silicon thin film, at least one of said first and second electrodes being transparent, and said structure including at least one barrier layer or junction for separating photo-ionized carriers, wherein the silicon thin film comprises a mixed phase of polycrystalline phase and a substantially terminated amorphous phase and includes at least about 50% by volume of fibrous crystalline grains, each of which has a bottom diameter of not larger than 1 μm and a height of at least 50 nm, and has its grain boundaries substantially terminated.

2. A thin film silicon solar cell as set forth in claim 1, wherein the general orientation of the height dimension of said fibrous crystalline grains forms an angle of 45 to 90 degrees with respect to said barrier layer.

3. A thin film silicon solar cell as set forth in claim 1, wherein said grain boundaries in the silicon thin film are terminated by at least one member selected from the group consisting of hydrogen, oxygen, fluorine, chlorine, iodine, lithium, sodium, potassium, cesium and rubidium.

4. A thin film silicon solar cell as set forth in claims 1 or 2, wherein said junction comprises a PN junction.

5. A thin film silicon solar cell as set forth in claims 1 or 2, wherein said junction comprises a PIN junction.

6. A thin film silicon solar cell as set forth in claims 1 or 2, wherein said barrier layer comprises a Schottky barrier contact.

7. A thin film silicon solar cell as set forth in claims 1, 2 or 3, wherein the silicon thin film includes an N+ type layer of 5 nm to 1 μm in thickness provided in contact with one of said first and second electrodes which is closer to said substrate.

8. A thin film silicon solar cell as set forth in claims 1, 2 or 3, wherein the silicon thin film includes a P+ type layer of 5 nm to 1 μm in thickness provided in contact with one of said first and second electrodes which is closer to said substrate.

9. A thin film silicon solar cell as set forth in claim 3, wherein said grain boundaries in the silicon thin film are terminated by at least one member selected from the group consisting of oxygen, fluorine, chlorine, iodine, lithium, sodium, potassium, cesium and rubidium.

10. A thin film silicon solar cell as set forth in claim 1, wherein the substantially terminated amorphous phase is disposed in the vicinity of the grain boundaries.

11. A thin film silicon solar cell as set forth in claims 3 or 9, wherein said at least one member is doped into the silicon thin film in a quantity of 10 ppm by atomic ratio to about 5 atomic-%.

12. A thin film silicon solar cell as set forth in claim 1, wherein the silicon thin film includes at least 0.1% by volume amorphous phase.

* * * * *